US005506531A

United States Patent [19]
Jang et al.

[11] Patent Number: 5,506,531
[45] Date of Patent: Apr. 9, 1996

[54] PHASE LOCKED LOOP CIRCUIT PROVIDING INCREASE LOCKING OPERATION SPEED USING AN UNLOCK DETECTOR

[75] Inventors: Hyun S. Jang; Gyu T. Hwang, both of Bubaleub, Rep. of Korea

[73] Assignee: Hyundai Electronics Industries Co., Ltd., Rep. of Korea

[21] Appl. No.: 319,424

[22] Filed: Oct. 6, 1994

[30]      Foreign Application Priority Data

Oct. 6, 1993  [KR]  Rep. of Korea .................. 1993-20667

[51] Int. Cl.$^6$ ...................................... H03L 7/06
[52] U.S. Cl. ........................... 327/156; 331/1 A; 331/25; 331/57; 331/DIG. 2; 375/376
[58] Field of Search ................................ 327/156, 155, 327/157, 159, 107; 331/1 A, 25, 57, DIG. 2; 326/93; 375/376

[56]           References Cited

U.S. PATENT DOCUMENTS

| | | | |
|---|---|---|---|
| 4,975,651 | 12/1990 | Hagiwara | 328/155 |
| 5,111,151 | 5/1992 | Ii | 328/155 |
| 5,144,254 | 9/1992 | Wilke | 328/14 |
| 5,162,910 | 11/1992 | Willis | 358/158 |
| 5,172,357 | 12/1992 | Taguchi | 369/48 |
| 5,180,933 | 1/1993 | Krzyzanowski | 307/514 |
| 5,180,992 | 1/1993 | Akiyama et al. | 331/11 |
| 5,307,382 | 4/1994 | Pang | 375/120 |
| 5,317,283 | 5/1994 | Korhonen | 331/1 A |

*Primary Examiner*—Timothy P. Callahan
*Assistant Examiner*—Kenneth B. Wells
*Attorney, Agent, or Firm*—Merchant, Gould, Smith, Edell, Welter & Schmidt

[57]           ABSTRACT

A phase locked loop circuit comprising a first counter for dividing a reference frequency at a division ratio predetermined or determined by an input unit, a second counter for dividing a frequency of an output signal from the phase locked loop circuit at a division ratio predetermined or determined by a different input unit, a phase detector for inputting output signals from the first and second counters and generating a voltage based on a phase difference between the inputted signals, a low pass filter for low pass filtering an output signal from the phase detector, and a voltage controlled oscillator for generating a frequency signal proportioned to an output voltage from the low pass filter. The phase locked loop circuit further comprises an unlock detector for generating a control signal for synchronization of one of the first and second counters with an earlier phase in response to an unlocked signal from the phase detector.

6 Claims, 4 Drawing Sheets

PHASE LOCKED LOOP CIRCUIT PROVIDING INCREASE LOCKING OPERATION SPEED USING AN UNLOCK DETECTOR

BACKGROUND OF THE INVENTION

1. Field of the Invention

The present invention relates in general to a phase locked loop (PLL) circuit, and more particularly to a PLL circuit in which a locked operation is performed at a high speed.

2. Description of the Prior Art

Generally, a PLL circuit is a closed circuit which generates a signal synchronized in phase and frequency with an input signal, and used in various forms in many types of equipment such as a communication radar, a computer, a frequency control instrumentation device, etc.

FIG. 1 is a block diagram of a conventional PLL circuit. As shown in this drawing, the conventional PLL circuit comprises an R counter 101 for dividing an input reference frequency $F_{Ref}$ by R, an N counter 102 for dividing an output of the PLL circuit fed back thereto by N. A phase detector 103 compares the phases of outputs $F_R$ and $F_N$ from the R and N counters 101 and 102, respectively, and outputs the resultant difference. A low pass filter (LPF) 104 is provided to low pass filter the output of the phase detector 103. A voltage controlled oscillator (VCO) 105 is provided for generating a frequency signal proportioned to a voltage value from the LPF 104.

Such a conventional PLL circuit remains in its locked state when the outputs $F_R$ and $F_N$ from the R and N counters 101 and 102, respectively, are synchronized with each other in phase and frequency. The R and N counters 101 and 102 may have the dividing factors R and N fixed or set by externally loaded values as needed. Time is required for a transition from an initial unlocked state to a locked state. If the outputs $F_R$ and $F_N$ from the R and N counters 101 and 102 have the same frequency but are out of phase during the transition from the initial unlocked state to the locked state, the VCO 105 changes the frequency and readjusts it when the signals are in phase, so that the PLL circuit becomes locked.

The above-mentioned conventional PLL circuit has a disadvantage in that the phase detector compares the signals $F_R$ and $F_N$ obtained by dividing the input frequencies with each other, resulting in an increase in the time required for the transition from the unlocked state to the locked state. For this reason, most types of equipment employing the PLL circuit have a response characteristic which is retarded due to the long locking time required.

SUMMARY OF THE INVENTION

The present investigation has been made in view of the above problem. An object of the present invention is to provide a PLL circuit which is locked at a high speed to enhance a response characteristic of the equipment to which it is applied.

In accordance with the present invention, the above and other objects can be accomplished by a provision of a phase locked loop circuit comprising a first counter for dividing a reference frequency at a division ratio predetermined or determined by input means; a second counter for dividing a frequency of an output signal from the phase locked loop circuit at a division ratio predetermined or determined by different input means; phase detection means for inputting output signals from said first and second counters and generating a voltage based on a phase difference between the inputted signals; a low pass filter for low pass filtering an output signal from said phase detection means; and a voltage controlled oscillator for generating a frequency signal proportioned to an output voltage from said low pass filter. The circuit further includes an unlock detection means for generating a control signal for synchronization of one of said first and second counters with an earlier phase in response to an unlocked signal from said phase detector.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
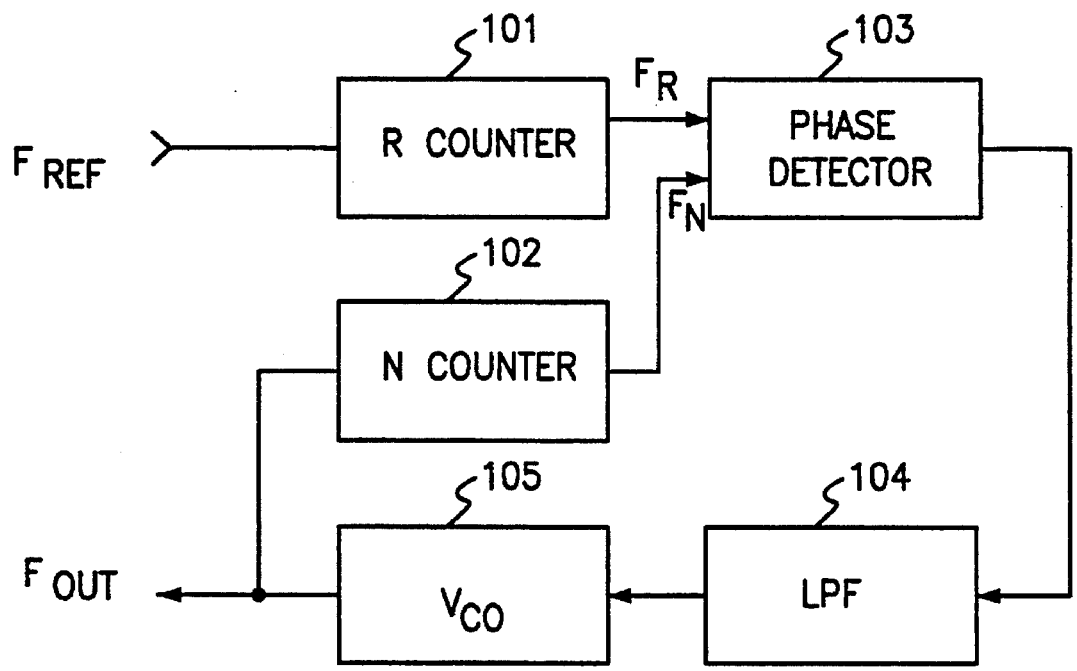
FIG. 1 is a block diagram of a conventional PLL circuit.
Figure 2:
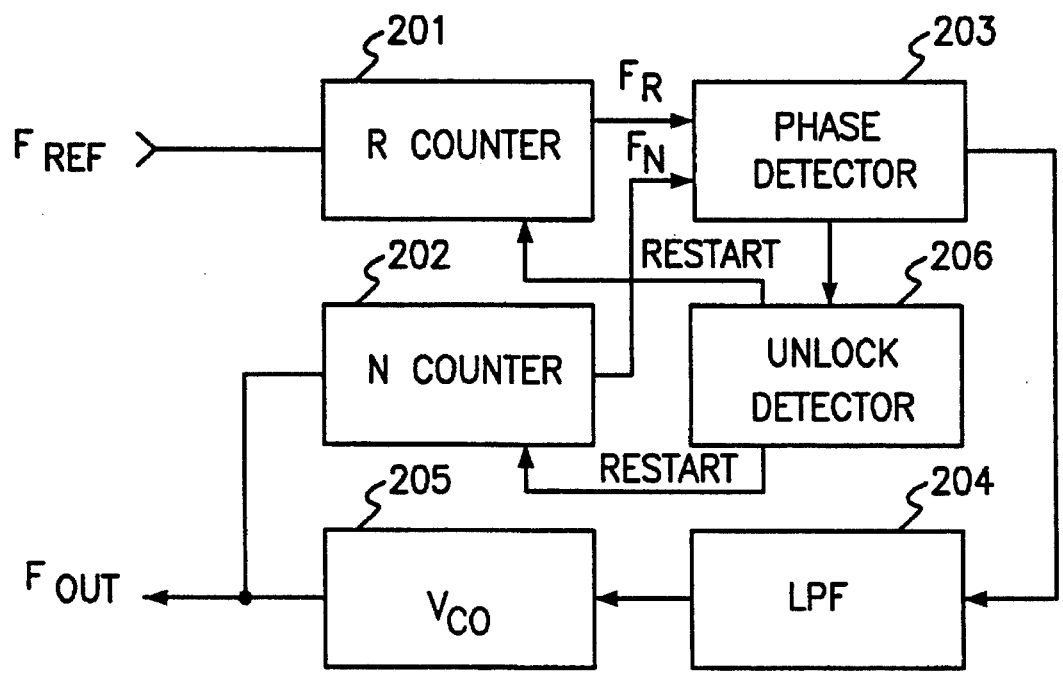
FIG. 2 is a block diagram of a PLL circuit of the present invention.

Referring to FIG. 2, there is shown a block diagram of a PLL circuit of the present invention. This PLL circuit is adapted to look at an unlocked range of an output signal from a phase detector and restart an R counter or an N counter in accordance with the result to arrange a phase synchronized loop.

As shown in FIG. 2, the PLL circuit comprises two feedback loops, first feedback loop consisting of a phase detector 203, a low pass filter (LPF) 204, a voltage controlled oscillator (VCO) 205 and an N counter 202. The second feedback loop includes an R counter 201, the phase detector 203 and an unlock detector 206. The use of the two feedback loops allows the PLL circuit to have very short locking time.

A possible source of the second feedback loop is self-characteristics of the counters.

In the PLL circuit, the R counter 201 and the N counter 202 are generally programmable counters, which allow divided clocks to have very small duty cycles due to variable division ratios.

The operation of the PLL circuit with the above-mentioned construction in accordance with the present invention will hereinafter be described in detail with reference to FIGS. 3 and 4, which are timing diagrams illustrating operations of the phase detector 203 and the unlock detector 206 based on an output signal $F_R$ from the R counter 201 and an output signal $F_N$ from the N counter 202.

During a high interval, the signal $F_R$ or $F_N$ is applied as a signal for reloading the counter division ratio. Because the duty cycle of the divided clock of the program counter is varied according to the division ratio, the digital phase detector typically acts as an edge comparator. In this case, the phase detector performs the edge comparison in response to the program counter load signal.

Figure 3:
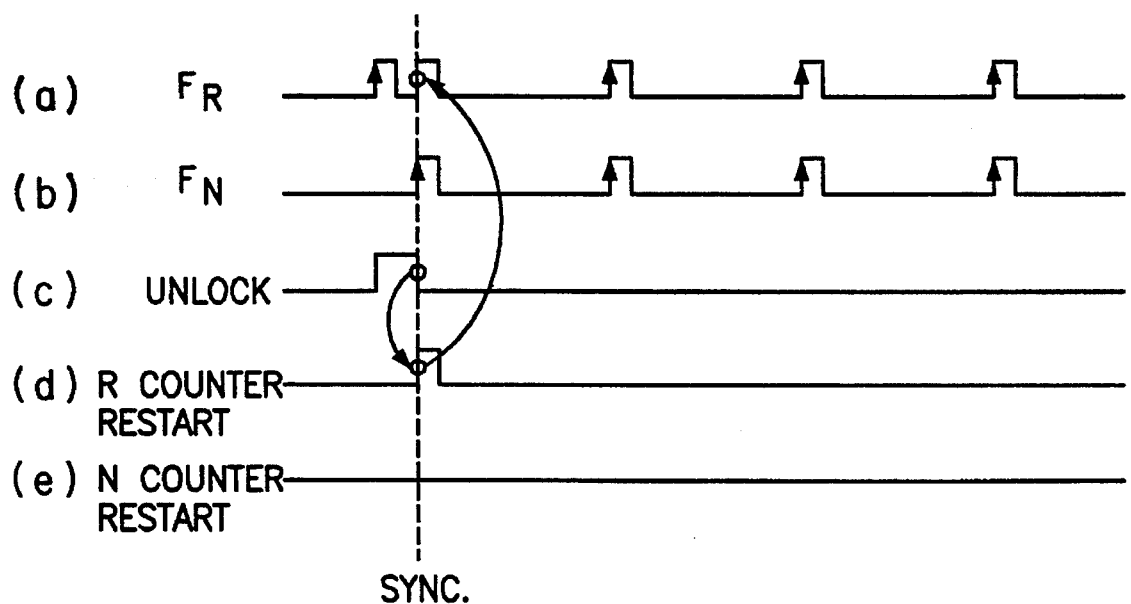
FIG. 3 is a timing diagram illustrating operations of a phase detector and an unlock detector in FIG. 2 when a signal $F_R$ is earlier in phase than a signal $F_N$.

In the case where the signal $F_R$ is earlier in phase than the signal $F_N$ as shown in FIG. 3, the phase detector 203 generates an unlocked signal corresponding to a phase difference between positive edges of the signals $F_R$ and $F_N$.

In accordance with the present invention, the PLL circuit is adapted to detect a low edge of the unlocked signal from the phase detector 203 and restart the program counter according to the resultant load signal to perform the phase synchronization. In this case, a phase difference from the phase detector 203 to the LPF 204 is not influenced by the second loop. Namely, the phase difference from the phase detector 203 is directly applied to the LPF 204 because the load signal is again generated at the low edge of the unlocked signal.

Because the signal $F_R$ is earlier in phase than the signal $F_N$ in FIG. 3, it will be synchronized to the signal $F_N$. Namely, the unlock detector 206 generates an R counter restart signal to reset the R counter 201.

Figure 4:
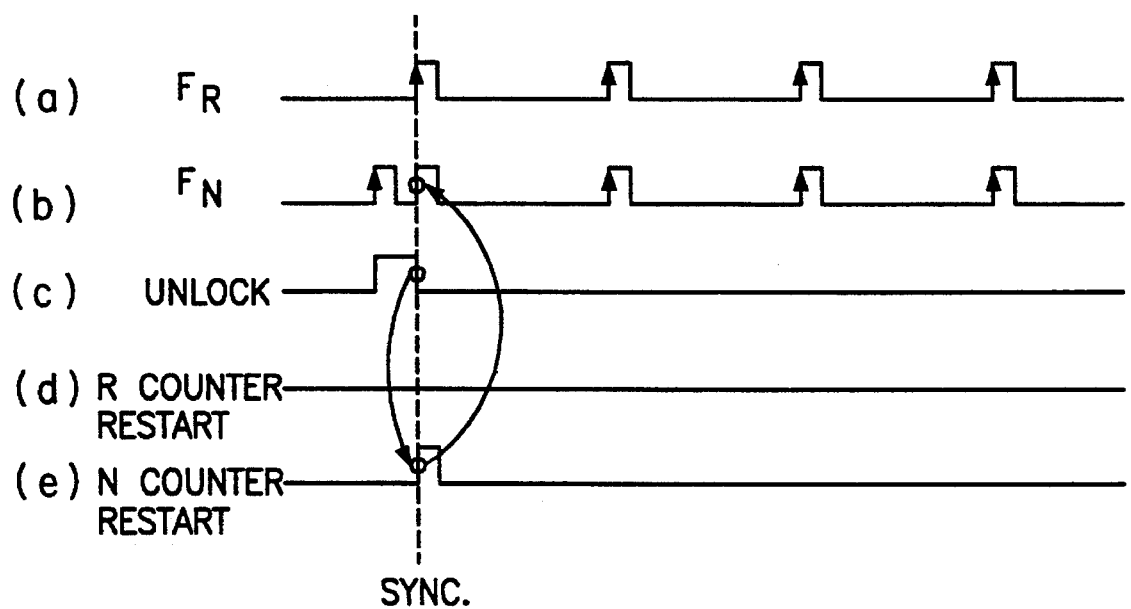
FIG. 4 is a timing diagram illustrating operations of the phase detector and unlock detector in FIG. 2 when the signal $F_N$ is earlier in phase than the signal $F_R$.

In the case where the signal $F_N$ is earlier in phase than the signal $F_R$ as shown in FIG. 4, the phase detector 203 generates an unlocked signal corresponding to a phase difference between positive edges of the signals $F_N$ and $F_R$. The unlock detector 206 detects a low edge of the unlocked signal from the phase detector 203 and outputs the resultant restart signal to restart the N counter 202.

Figure 5:
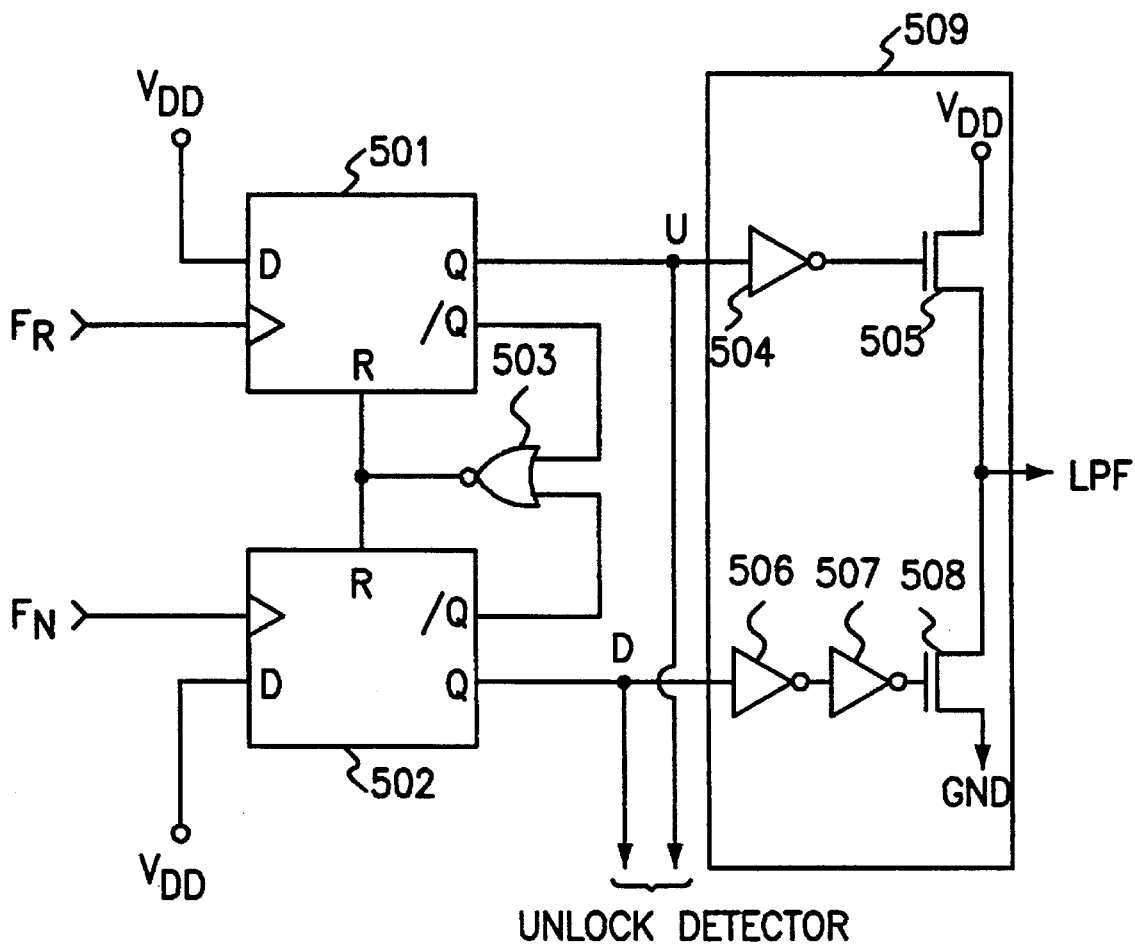
FIG. 5 is a detailed circuit diagram of the phase detector in FIG. 2.

Referring to FIG. 5, there is shown a detailed circuit diagram of the phase detector 203 in FIG. 2. As shown in this drawing, the phase detector 203 includes a D flip-flop 501 having a data input terminal for inputting a power source voltage $V_{DD}$ and a clock input terminal for inputting the output signal $F_R$ from the R counter 201, a D flip-flop 502 having a data input terminal for inputting the power source voltage $V_{DD}$ and a clock input terminal for inputting the output signal $F_N$ from the N counter 202, a NOR gate 503 for resetting the D flip-flops 501 and 502 in response to inverted output signals from the D flip-flops 501 and 502, and a charge pump 509 for inputting non-inverted output signals U and D from the D flip-flops 501 and 502.

The charge pump 509 includes an inverter 504 for inverting the non-inverted output signal U from the D flip-flop 501, a P-type transistor 505 having a gate for inputting an output signal from the inverter 504 and a source for inputting the power source voltage $V_{DD}$. The charge pump 509 further includes an inverter 506 for inverting the non-inverted output signal D from the D flip-flop 502, an inverter 507 for inverting an output signal from the inverter 506, and an N-type transistor 508 having a gate for inputting an output signal from the inverter 507. The drain of N-Type transistor 508 is connected to a drain of the P-type transistor 505. The source of N-type transistor 508 is connected to a ground.

The unlocked signal is generated at a signal output terminal of one of the D flip-flops 501 and 502 which is first triggered positively. If the signal $F_R$ is earlier in phase than the signal $F_N$, the positive output signal U from the D flip-flop 501 remains at its high state during an interval corresponding to a phase difference between the positive edges of the signals $F_R$ and $F_N$, whereas the positive output signal D from the D flip-flop 502 remains at its low state. If the signal $F_N$ is earlier in phase than the signal $F_R$, then the positive output signal D from the D flip-flop 502 remains at its high state during an interval corresponding to a phase difference between the positive edges of the signals $F_N$ and $F_R$, whereas the positive output signal U from the D flip-flop 501 remains at its low state.

The positive output signals U and D from the D flip-flops 501 and 502 are passed through the charge pump 509 before reaching the LPF 204, so that the input voltage to the VCO 205 is increased or decreased.

The positive output signals U and D from the D flip-flops 501 and 502 are also applied to the unlock detector 206 to produce the signals for restarting the R counter and the N counter.

Figure 6:
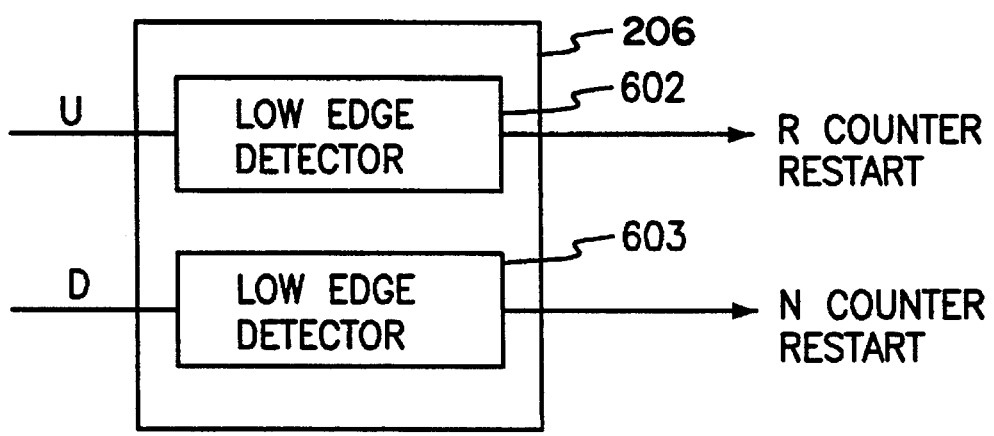
FIG. 6 is a detailed block diagram of the unlock detector in FIG. 2.

Referring to FIG. 6, there is shown a detailed block diagram of the unlock detector 206 in FIG. 2. As shown in this drawing, the unlock detector 206 includes a pair of low edge detectors 602 and 603 for generating the R and N counter restart signals in response to the unlocked signals U and D from the phase detector 203, respectively. Each of the low edge detectors 602 and 603 is adapted to generate the restart signal by detecting the low edge of the corresponding unlocked signal, as shown in FIG. 7.

Figure 7:
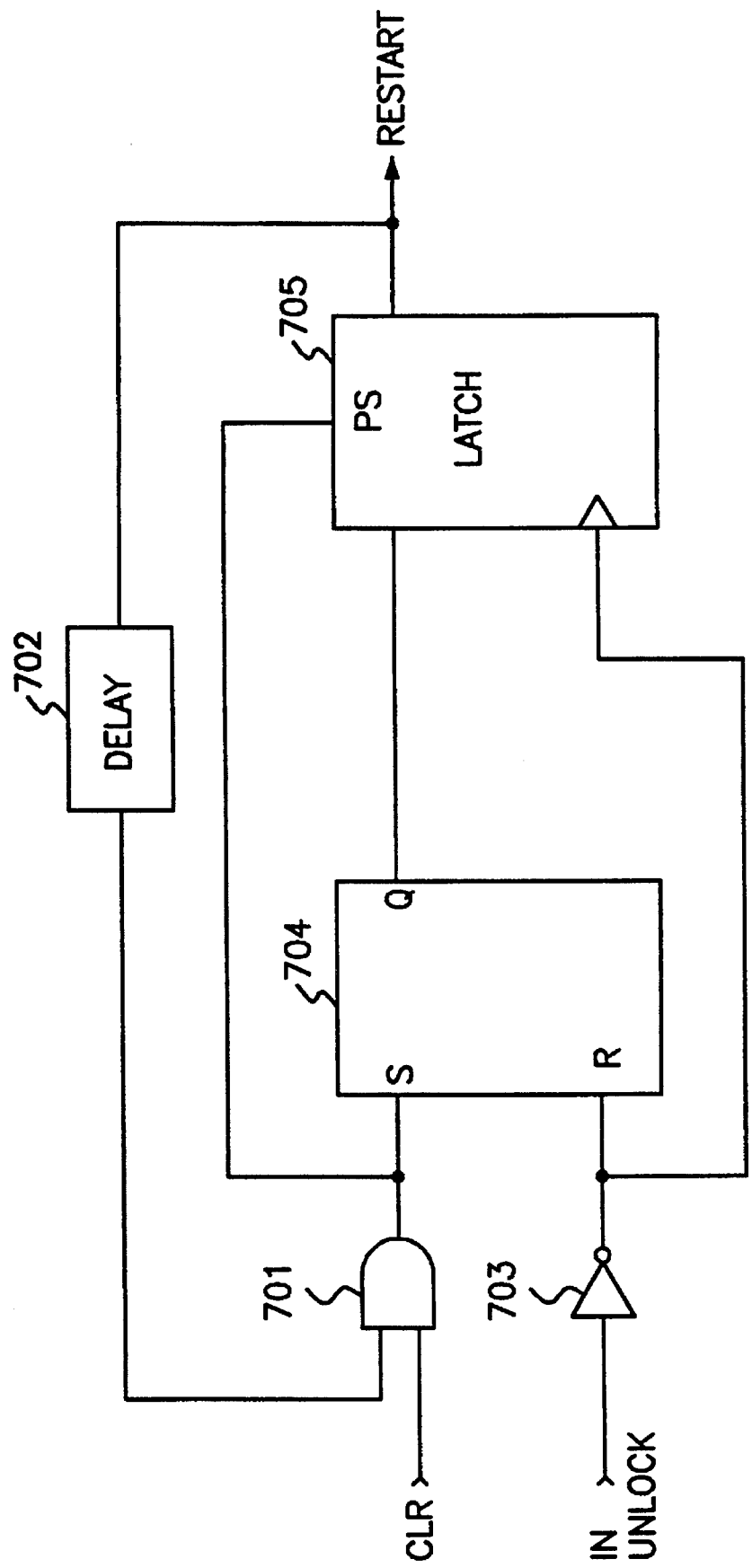
FIG. 7 is a detailed circuit diagram of a low edge detector in FIG. 6.

Referring to FIG. 7, there is shown a detailed circuit diagram of the low edge detectors 602 and 603 in FIG. 6. As shown in this drawing, each low edge detector includes an AND gate 701 for inputting an external initialization signal Clr and the restart signal from the low edge detector delayed through a delay 702, an inverter 703 for inverting the unlocked signal from the phase detector 203, an RS flip-flop 704 having a reset terminal for inputting an output signal from the AND gate 701 and a set terminal for inputting an output signal from the inverter 703, and a latch 705 having a preset terminal for inputting the output signal from the AND gate 701, a clock input terminal for inputting the output signal from the inverter 703 and a data input terminal for inputting an output signal from the RS flip-flop 704. The initialization signal Clr initializes the edge detector to generate the restart signal for a period delayed from the low edge of the unlocked signal.

As apparent from the above description, according to the present invention, the PLL circuit has the very short locking time as compared with the conventional PLL circuit. This has the effect of enhancing a response characteristic of equipment to which the PLL circuit is applied.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phase locked loop circuit, comprising:
   a first counter coupled to receive a reference frequency signal, the first counter dividing the reference frequency signal by a first division ratio and outputting a first divided signal;
   a second counter coupled to receive a feedback signal of an output signal of the phase locked loop, the second counter dividing the feedback signal by a second division ratio and outputting a second divided signal;
   a phase detection means, coupled to the first counter and the second counter to receive the first divided signal and to receive the second divided signal, respectively, for generating a voltage signal based on a phase difference between the first divided signal and the second divided signal and for generating an unlocked signal corresponding to the phase difference;

a low pass filter coupled to receive the voltage signal from the phase detection means, said low pass filter filtering the voltage signal into a low pass voltage signal;

a voltage controlled oscillator, coupled to receive the low pass voltage signal, the voltage controlled oscillator generating the output signal having a frequency which is proportional to the low pass voltage signal; and an unlock detection means, coupled to receive the unlocked signal, for generating a restart signal applied to one of said first and second counters to synchronize a phase of said one of said first and second counters with that of the other of said first and second counters, said unlock detection means including, an AND gate coupled to receive an initialization signal provided externally to said phase locked loop circuit and the restart signal via a delay circuit, an invertor coupled to receive the unlocked signal from said phase detection means to produce an inverted unlocked signal, an RS flip-flop having a first input terminal connected to receive an output of said AND gate and a second input terminal connected to receive the inverted unlocked signal, and a latch, having a preset terminal connected to receive the output signal from said AND gate, a clock input terminal connected to receive the inverted unlocked signal, a data input terminal connected to receive an output signal from said RS flip-flop and an output terminal for outputting the restart signal.

2. A phase lock loop circuit as recited in claim 1, wherein said phase detection means comprises:

a first D flip-flop having a data input terminal coupled to a power source voltage and a clock input terminal coupled to receive the first divided signal;

a second D flip-flop having a data input terminal coupled to the power source voltage and a clock input terminal coupled to receive the second divided signal;

a NOR gate for resetting said first and second D flip-flops in response to inverting output signals from said first and second D flip-flops; and a charge pump coupled to receive non-inverting output signals form said first and second D flip-flops.

3. A phase locked loop as recited in claim 2, wherein said charge pump comprises:

a first inverter coupled to said first D flip-flop to invert the non-inverting output signal from said first D flip-flop;

a p-type transistor having a gate coupled to receive an output from the first inverter and a source coupled to the power source voltage;

a second inverter coupled to said second D flip-flop to invert the non-inverting output signal from said second D flip-flop;

a third inverter coupled to invert an output from said second inverter; and an n-type transistor having a gate coupled to receive an output from said third inverter, a drain coupled to a drain of the p-type transistor and a source coupled to ground.

4. A phase locked loop circuit, comprising:

a first counter coupled to receive a reference frequency signal, the first counter dividing the reference frequency signal by a first division ratio and outputting a first divided signal;

a second counter coupled to receive a feedback signal of an output signal of the phase locked loop, the second counter dividing the feedback signal by a second division ratio and outputting a second divided signal;

a phase detection means, coupled to the first counter and the second counter to receive the first divided signal and to receive the second divided signal, respectively, for generating a voltage signal based on a phase difference between the first divided signal and the second divided signal and for generating an unlocked signal corresponding to the phase difference;

a low pass filter coupled to receive the voltage signal from the phase detection means, said low pass filter filtering the voltage signal into a low pass voltage signal;

a voltage controlled oscillator, coupled to receive the low pass voltage signal, the voltage controlled oscillator generating the output signal having a frequency which is proportional to the low pass voltage signal; and an unlock detection means, coupled to receive the unlocked signal, for generating a control signal applied to one of said first and second counters to synchronize a phase of said one of said first and second counters with that of the other of said first and second counters, said unlock detection means including a pair of low edge detection circuits, each of said low edge detection circuits generating a restart signal in response to the unlocked signal from said phase detection means and outputting the restart signal to a corresponding one of said first and second counters as said control signal.

5. A phase locked loop as recited in claim 4, wherein each of said low edge detection circuits comprises:

an AND gate coupled to receive an initialization signal provided externally to said phase locked loop circuit and the restart signal via a delay circuit, an invertor coupled to receive the unlocked signal from said phase detection means to produce an inverted unlocked signal, an RS flip-flop having a first terminal connected to receive an output of said AND gate and a second terminal connected to receive the inverted unlocked signal, and a latch, having a preset terminal connected to receive the output signal from said AND gate, a clock input terminal connected to receive the inverted unlocked signal, a data input terminal connected to receive an output signal from said RS flip-flop and an output terminal for outputting the restart signal.

6. A phase locked loop circuit, comprising:

a first counter coupled to receive a reference frequency signal, the first counter dividing the reference frequency signal by a first division ratio and outputting a first divided signal;

a second counter coupled to receive a feedback signal of an output signal of the phase locked loop, the second counter dividing the feedback signal by a second division ratio and outputting a second divided signal;

a phase detection means, coupled to the first counter and the second counter to receive the first divided signal and to receive the second divided signal, respectively, for generating a voltage signal based on a phase difference between the first divided signal and the second divided signal and for generating an unlocked signal corresponding to the phase difference;

a low pass filter coupled to receive the voltage signal from the phase detection means, said low pass filter filtering the voltage signal into a low pass voltage signal;

a voltage controlled oscillator, coupled to receive the low pass voltage signal, the voltage controlled oscillator generating the output signal having a frequency which is proportional to the low pass voltage signal; and an unlock detection means, coupled to receive the unlocked signal, for generating a control signal applied to one of said first and second counters to synchronize a phase of said one of said first and second counters with that of the other of said first and second counters by restarting said one of said first and second counters in response to said control signal.

* * * * *